(12) United States Patent
Hall et al.

(10) Patent No.: US 7,116,000 B2
(45) Date of Patent: Oct. 3, 2006

(54) UNDERFILLED, ENCAPSULATED SEMICONDUCTOR DIE ASSEMBLIES AND METHODS OF FABRICATION

(75) Inventors: Frank L. Hall, Boise, ID (US); Cary J. Baerlocher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 10/785,122

(22) Filed: Feb. 24, 2004

(65) Prior Publication Data

US 2004/0164413 A1    Aug. 26, 2004

Related U.S. Application Data

(62) Division of application No. 10/191,655, filed on Jul. 8, 2002.

(51) Int. Cl.
 *H01L 23/48* (2006.01)
(52) U.S. Cl. .................. 257/783; 257/784; 257/787
(58) Field of Classification Search ............. 257/783, 257/784, 787, E23.121, E23.126, E23.127
See application file for complete search history.

(56) References Cited

U.S. PATENT DOCUMENTS

| | | | |
|---|---|---|---|
| 4,048,670 A | 9/1977 | Eysermans | |
| 5,548,160 A * | 8/1996 | Corbett et al. | 257/666 |
| 5,561,329 A | 10/1996 | Mine et al. | |
| 5,585,600 A * | 12/1996 | Froebel et al. | 174/52.4 |
| 5,596,366 A | 1/1997 | Takashima et al. | |
| 5,710,071 A | 1/1998 | Beddingfield et al. | |
| 5,719,440 A * | 2/1998 | Moden | 257/697 |
| 5,840,598 A * | 11/1998 | Grigg et al. | 438/118 |
| 5,886,404 A | 3/1999 | You | |
| 5,917,242 A | 6/1999 | Ball | |
| 6,060,768 A | 5/2000 | Hayashida et al. | |
| 6,165,819 A | 12/2000 | Seki et al. | |
| 6,221,689 B1 | 4/2001 | Maa et al. | |
| 6,225,144 B1 | 5/2001 | How et al. | |
| 6,229,202 B1 | 5/2001 | Corisis | |
| 6,297,547 B1 | 10/2001 | Akram | |
| 6,297,560 B1 | 10/2001 | Capote et al. | |
| 6,359,334 B1 * | 3/2002 | Jiang | 257/706 |
| 6,376,915 B1 | 4/2002 | Hikita et al. | |

(Continued)

OTHER PUBLICATIONS

Tummala et al., Microelectronics Packaging Handbook Semiconductor Packaging Part II, Chapman and Hall, 2$^{nd}$ Ed., 1997, pp. 25-26, 42-44, 91-93, 887-890.*

*Primary Examiner*—Jerome Jackson
*Assistant Examiner*—José R. Diaz
(74) *Attorney, Agent, or Firm*—TraskBritt (57) ABSTRACT

An apparatus and method for packaging a semiconductor die and a carrier substrate to substantially prevent trapped moisture therebetween and provide a robust, inflexible cost-effective bond. The semiconductor die is attached to the carrier substrate with a plurality of discrete adhesive elements so as to provide a gap or standoff therebetween. Wire bonds may then be formed between bond pads on the semiconductor die to conductive pads or terminals on the carrier substrate. With this arrangement, a dielectric filler material is disposed in the gap or standoff to form a permanent bonding agent between the semiconductor die and the carrier substrate. By applying the dielectric filler material after forming the wire bonds, the dielectric filler material coats at least a portion of the wire bonds to stabilize the wire bonds and prevent wire sweep in an encapsulation process, such as transfer molding, performed thereafter.

42 Claims, 5 Drawing Sheets

U.S. PATENT DOCUMENTS

| | | |
|---|---|---|
| 6,455,923 B1 | 9/2002 | Jiang et al. |
| 6,465,734 B1 | 10/2002 | Yamada et al. |
| 6,476,507 B1 | 11/2002 | Takehara |
| 6,519,846 B1 | 2/2003 | Park et al. |
| 6,563,217 B1 | 5/2003 | Corisis et al. |
| 6,593,662 B1 | 7/2003 | Pu et al. |
| 6,670,702 B1 | 12/2003 | Corisis et al. |
| 6,673,656 B1 | 1/2004 | Chung |
| 6,700,210 B1 | 3/2004 | Smith |
| 6,707,166 B1 | 3/2004 | Noguchi |
| 6,731,013 B1 | 5/2004 | Juso et al. |
| 6,747,361 B1 | 6/2004 | Ichinose |
| 6,906,415 B1 | 6/2005 | Jiang et al. |
| 6,940,184 B1 | 9/2005 | Ueda et al. |
| 2002/0074645 A1 | 6/2002 | Dickey et al. |
| 2002/0100989 A1 | 8/2002 | Jiang et al. |
| 2002/0171142 A1 | 11/2002 | Kinsman |
| 2002/0171143 A1 | 11/2002 | Kinsman |
| 2003/0045072 A1 | 3/2003 | Jiang |
| 2003/0116866 A1 | 6/2003 | Cher 'Khng et al. |
| 2003/0173679 A1 | 9/2003 | Levardo et al. |
| 2003/0230801 A1 | 12/2003 | Jiang et al. |

\* cited by examiner

UNDERFILLED, ENCAPSULATED SEMICONDUCTOR DIE ASSEMBLIES AND METHODS OF FABRICATION

CROSS-REFERENCE TO RELATED APPLICATION

This application is a divisional of application Ser. No. 10/191,655, filed Jul. 8, 2002, pending.

BACKGROUND OF THE INVENTION

1. Field of the Invention

The present invention relates generally to methods and apparatus for assembling semiconductor dice to a carrier substrate. In particular, the present invention relates to methods and apparatus of underfill bonding semiconductor dice to a carrier substrate and various assembly arrangements with respect to underfill bonding semiconductor dice to a carrier substrate followed by encapsulation.

2. State of the Art

Chip-On-Board ("COB") or Board-On-Chip ("BOC") technology is used to attach a semiconductor die directly to a carrier substrate, such as an interposer or printed circuit board. Electrical and mechanical interconnection used in COB or BOC technology may include flip-chip attachment techniques, wire bonding techniques, or tape automated bonding ("TAB") techniques.

Flip-chip attachment generally includes electrically and mechanically attaching a semiconductor die by its active surface to a carrier substrate using a pattern of discrete conductive elements therebetween. The discrete conductive elements are generally disposed on the active surface of the die or an interposer during fabrication of the semiconductor die package, but may instead be disposed on the carrier substrate. The discrete conductive elements may comprise minute conductive bumps, balls or columns of various configurations. Each discrete conductive element is placed corresponding to mutually aligned locations of bond pads (or other I/O locations) on the semiconductor die (or interposer) and terminals on the carrier substrate when the two components are superimposed. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate and around the discrete conductive elements for environmental protection and to enhance the mechanical attachment of the die to the carrier substrate. For example, U.S. Pat. No. 5,710,071 to Beddingfield et al. discloses an exemplary flip-chip attachment of a semiconductor die to a substrate and a method of underfilling a gap between the semiconductor die and substrate.

Wire bonding and TAB attachment techniques generally begin with attaching a semiconductor die by its back side or its active surface to the surface of a carrier substrate with an appropriate adhesive, such as an epoxy or silver solder, a liquid or gel adhesive, a double-sided adhesive-coated tape segment such as Kapton®, a polyimide. In wire bonding, fine wires of gold, aluminum or alloys thereof, are discretely attached to bond pads on the semiconductor die and then extended and bonded to corresponding terminal pads on the carrier substrate. A dielectric encapsulant such as a silicone or epoxy may then be applied to protect the fine wires and bond sites. In TAB attachment, ends of metal traces carried on a flexible insulating tape such as a polyimide are attached, as by thermocompression bonding, directly to the bond pads on the semiconductor die and corresponding terminal pads on the carrier substrate.

Particularly in the case of wire bonding followed by transfer or other molding process to encapsulate a die and carrier substrate assembly, there are problems in securing the semiconductor dice to the carrier substrates using an adhesive-coated tape. Specifically, by conventionally utilizing adhesive tape in attaching a semiconductor die to a carrier substrate followed by overmolding, moisture associated with the adhesive becomes trapped, ultimately resulting in moisture sensitivity issues in the form of enhanced potential for delamination of the components of the semiconductor die assembly. Further, the cost of the large volume of adhesive tape used to attach large numbers of dice to carrier substrates becomes excessive. In addition, the conventional use of substantial volumes (as measured by surface area) of tape is required to avoid stress defect failure in semiconductor die assemblies. Finally, even with the use of substantial tape coverage between a semiconductor die and its carrier substrate, the bond and resulting assembly may be undesirably flexible and resilient.

Another ongoing problem with the use of wire bonding in packaging occurs during a transfer molding encapsulation process of the semiconductor die in what is known as "wire sweep". Wire sweep results when a wave front of dielectric (commonly a silicon-filled polymer) encapsulation material moving through a mold cavity across the semiconductor die and carrier substrate assembly forces wire bonds to contact adjacent wire bonds and become fixedly molded in such a contacted position after the encapsulation material sets. When wire sweep occurs, a wire bond interconnection of a semiconductor die to a carrier substrate short circuits, which results in a nonfunctional semiconductor die assembly. Wire bond sweeping may also result in bond wire breakage or disconnection from a bond pad or terminal.

Yet another problem with conventional techniques is that of bleed of molding compound introduced into a mold cavity to form a dielectric encapsulant over the die and carrier substrate, which problem particularly manifests itself in the case of BOC-type assemblies wherein bond pads of a semiconductor die accessed through a slot in a carrier substrate are wire bonded prior to encapsulation. Under certain conditions, such as where the die fails to overlap the slot sufficiently, pressure of the molding compound in conjunction with the configuration of the assembly causes molding compound to bleed out of the mold cavity.

Therefore, it would be advantageous to utilize wire bonding in packaging in combination with an assembly and encapsulation technique to substantially eliminate moisture sensitivity issues as well as being cost efficient and providing a more robust semiconductor die assembly. It would also be advantageous to utilize wire bonding packaging techniques while substantially eliminating the problem of wire sweep and molding compound bleed.

BRIEF SUMMARY OF THE INVENTION

The present invention relates to methods and apparatus for mutually securing and encapsulating a semiconductor substrate and a carrier substrate to substantially reduce or even prevent trapping of moisture at the interface between the semiconductor substrate and carrier substrate. The present invention also relates to methods and apparatus for substantially preventing "wire sweep" in wire bonding packaging techniques.

The semiconductor substrate includes a back surface and an active surface with bond pads exposed thereon. The carrier substrate includes a surface with conductive pads or terminals exposed thereon. The semiconductor substrate is attached to the carrier substrate in a position and orientation so that wire bonds may be extended between the conductive pads or terminals on the surface of the carrier substrate and the bond pads on the active surface of the semiconductor substrate. Such attachment is facilitated by a plurality of adhesive elements of relatively small surface area, in comparison to the "footprint" of the semiconductor substrate over the carrier substrate, which provides an initial bond between the semiconductor substrate and the carrier substrate while providing a gap or standoff therebetween. A dielectric filler material is then disposed in the gap or standoff area to act as a permanent bonding agent between the semiconductor substrate and the carrier substrate.

In one embodiment, the carrier substrate includes an opening, for example, in the form of a slot extending between the first and second surface thereof. The semiconductor substrate is attached by its active surface to a surface of the carrier substrate so that the bond pads of the semiconductor substrate are exposed through the opening. Wire bonds are then formed between the exposed bond pads on the semiconductor substrate and the conductive pads on the surface of the carrier substrate opposite that to which the semiconductor substrate is secured so that the wire bonds extend through the opening.

In this embodiment, the dielectric filler material is introduced into the gap or standoff area between the semiconductor substrate and the carrier substrate to establish a permanent bond between the semiconductor substrate and the carrier substrate and to substantially fill the slot and secure the wire bond in place. In one aspect of the present invention, the dielectric filler material may be applied to the gap or standoff area through the opening in the carrier substrate. As such, at least a portion of each of the wire bonds in the opening is encapsulated by the dielectric filler material, stabilizing the wire bonds against potential wire sweep. After applying the dielectric filler material, a dielectric encapsulation material may be applied, as by transfer molding, injection molding or other technique known in the art, to fully encapsulate the wire bonds, and an overmold of encapsulation material may be likewise applied over the semiconductor substrate on the other side of the carrier substrate.

According to the present invention, the stabilization of the wire bonds via the dielectric filler material surrounding the wire bonds prevents wire sweep between adjacent wire bonds during the encapsulation process. Further, by utilizing the dielectric filler material and not a large adhesive tape segment or segments to permanently bond the semiconductor substrate to the carrier substrate, any moisture sensitivity problems in the assembled semiconductor die assembly are substantially eliminated while a more robust and rigid bond between the semiconductor substrate and the carrier substrate minimizes the potential for stress defect failure.

In another embodiment of the present invention, the semiconductor substrate may be attached by its back side to the carrier substrate. In such an arrangement, the bond pads on the active surface of the semiconductor substrate are usually proximate one or more peripheral edges thereof. Wire bonds may be formed between the bond pads on the semiconductor substrate and conductive pads or terminals on the carrier substrate. Dielectric filler material may be dispensed in the gap or standoff area provided by a plurality of relatively small surface area adhesive elements between the semiconductor substrate and carrier substrate to act as a primary bonding structure between the semiconductor substrate and carrier substrate. The wire bonds may then be encapsulated with an overmolded encapsulation material. Similar to the first embodiment, bonding the semiconductor substrate to the carrier substrate using the dielectric filler material substantially prevents moisture therebetween. The dielectric filler material also surrounds portions of the wire bonds, which stabilizes the wire bonds against wire sweep during the encapsulation process.

In another aspect of the present invention, the semiconductor substrate is mounted to a circuit board in an electronic system, such as a computer system. In the electronic system, the circuit board is electrically connected to a processor device which electrically communicates with an input device and an output device.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures are designated by the same or similar reference numerals.

Figure 1:
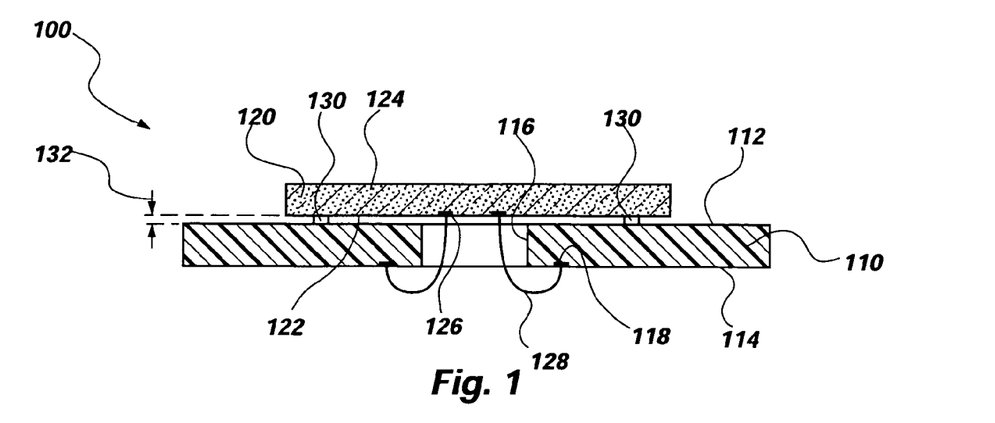
FIG. 1 illustrates a simplified cross-sectional view of a semiconductor assembly, depicting a semiconductor die attached to a semiconductor substrate with an adhesive element providing a gap therebetween, according to a first embodiment of the present invention.
Figure 2:
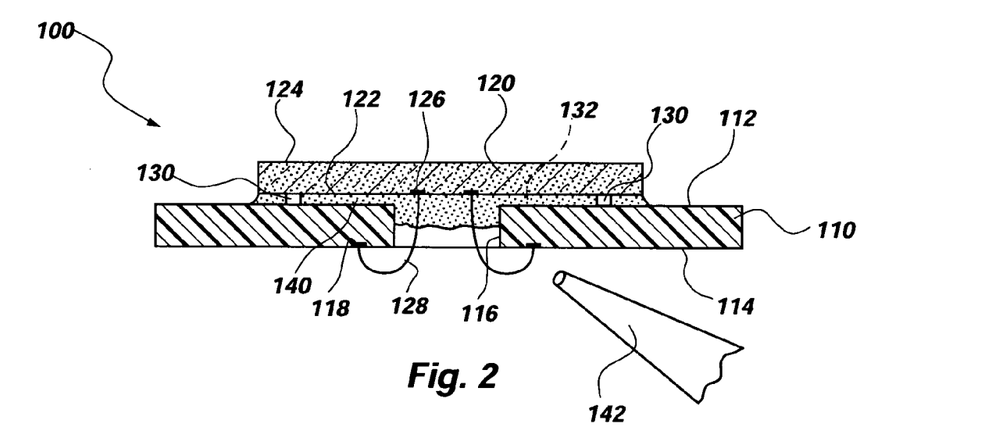
FIG. 2 illustrates a simplified cross-sectional view of a semiconductor assembly, depicting filler material provided in the gap between a semiconductor die and substrate through an opening in the substrate, according to the first embodiment of the present invention.
Figure 3:
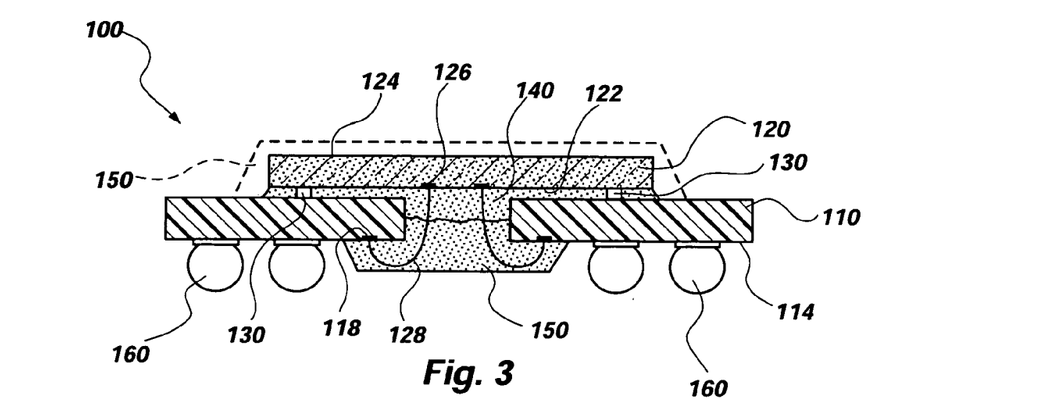
FIG. 3 illustrates a simplified cross-sectional view of a semiconductor assembly, depicting wire bonds extending through the opening encapsulated by an encapsulation material, according to the first embodiment of the present invention.

FIGS. 1–3 illustrate a process that may be used for packaging a semiconductor assembly 100. Referring first to FIG. 1, a carrier substrate 110 is attached to a semiconductor substrate in the form of semiconductor die 120 with a plurality of discrete adhesive elements 130 therebetween. The carrier substrate 110 includes a first surface 112 and a second surface 114, wherein the substrate 110 may include an opening 116 therein in, for example, the form of a slot extending from the first surface 112 to the second surface 114. The carrier substrate 110 may be any suitable type of substrate known in the art, such as an interposer or printed circuit board. Carrier substrate 110 may also be made of any type of substrate material known in the art, such as bismaleimide triazine (BT) resin, ceramics, or FR-4 or FR-5 materials.

The semiconductor die 120 includes an active surface 122 and a back surface 124 with bond pads 126 formed on the active surface 122. The bond pads 126 may be centrally located and exposed in one or more rows on the active surface 122 of the semiconductor die 120 and interconnected with integrated circuitry (not shown) within the semiconductor die 120. The semiconductor die 120 is preferably formed from silicon, but may be formed from germanium, gallium arsenide or indium phosphide, or any known semiconductive material whose electrical conductivity and resistivity lie between those of a conductor and an insulator. As used herein, the term "semiconductor substrate" includes singulated dice, groups of dice (partial wafers) and bulk substrates of semiconductive materials other than conventional wafers and including, without limitation, silicon on glass (SOG), silicon on insulator (SOI) and silicon on sapphire (SOS) substrates.

The active surface 122 of the semiconductor die 120 is attached face down (as depicted) to the first surface 112 of the carrier substrate 110 so that the bond pads 126 are exposed through the opening 116. The semiconductor die 120 is attached to the carrier substrate 110 with one or more, and preferably at least two, discrete adhesive elements 130. The discrete adhesive elements 130 are configured so as to provide a gap or standoff 132 between the semiconductor die 120 and carrier substrate 110. Further, the attachment using one or more discrete adhesive elements 130 disposed between the semiconductor die 120 and the carrier substrate 110 is sized and configured as a temporary attachment to secure the semiconductor die 120 and carrier substrate 110 together in proper relative position and alignment prior to the introduction of another, primary bonding agent between the two components. The adhesive elements 130 may be any known adhesive structures, such as adhesive-coated dielectric tape segments such as Kapton® or other polymer segments, reduced tape decals, or epoxy drops applied to one of the components and partially cured before application of the other thereto, preformed adhesive segments, or the like. The adhesive elements 130 may also comprise metallic or other conductive bonding elements, such as a bond facilitated with solder or solder balls or the like so as to raise the semiconductor die 120 from the surface of the substrate 110 to provide the gap or standoff 132 therebetween. Of course, in that instance, a suitable dielectric may be interposed between active surface 122 and the metallic bonding elements unless the metallic or other conductive bonding elements were used to ground or electrically bias the semiconductor die 120. With this arrangement, wire bonds 128 may be formed between the bond pads 126 on the active surface 122 of the semiconductor die 120 and conductive pads or terminals 118 on the second surface 114 of the substrate 110 so that the wire bonds 128 extend through the opening 116.

Turning to FIG. 2, the semiconductor assembly 100 is then ready to receive a dielectric filler material 140 from, for example, a dispenser head 142. In particular, dielectric filler material 140 may be dispensed from the dispenser head 142 so that the dielectric filler material 140 is provided to the gap 132 between the semiconductor die 120 and carrier substrate 110 through the opening 116. The dielectric filler material 140 may then extend into and substantially fill the gap 132 by capillary action or any other suitable method known in the art, such as methods utilizing gravity and/or pressurization or application of a vacuum to an outer periphery of gap 132. FIG. 2 is reversed from a conventional orientation wherein dispenser head 142 is located above the semiconductor assembly 100 for consistency and clarity among FIGS. 1–3.

According to the present invention, the dielectric filler material 140 coats and/or encapsulates at least a portion of the wire bonds 128 proximate the bond pads 126 on the active surface 122 of the semiconductor die 120 and within opening 116. The curing or hardening of dielectric filler material 140 surrounding the wire bonds 128 provides a stabilizing effect to the wire bonds 128 to help prevent movement thereof and wire sweep between adjacent wire bonds 128. Moreover, according to the present invention, by limiting the initial use of adhesive material as much as possible so as to utilize only the minimum size, number and arrangement of discrete adhesive elements 130 necessary to secure semiconductor die 120 to carrier substrate 110 for wire bonding and to provide the gap or standoff 132, any moisture in the adhesive element 130 is also limited. The dielectric filler material 140 may then be introduced to fill the gap or standoff 132 and provide a permanent, secure and inflexible bond between the semiconductor die 120 and carrier substrate 110, wherein any problems due to moisture being trapped therebetween are substantially eliminated. Exemplary, suitable filler materials T693-R3001EX-V3 and T693-R3002EX-V3, both offered by Nagase Chemtex. Also, utilizing dielectric filler material 140 to bond the semiconductor die 120 to the carrier substrate 110 is much more cost effective, in comparison to utilizing adhesive element or elements as a primary bonding agent. It should be noted that the particle size of the dielectric filler material is generally substantially smaller than particle size of filled polymer encapsulants used, for example, in transfer molding, enhancing flow of the dielectric filler material past and surrounding wire bonds 128.

FIG. 3 illustrates the semiconductor assembly with an envelope of dielectric encapsulation material 150 formed thereon. Specifically, a dielectric encapsulation material 150 is formed at least partially over the second surface 114 of the carrier substrate 110 so that each of the wire bonds 128 are fully encapsulated. Dielectric encapsulation material 150 may also be formed over the back surface 124 and sides of semiconductor die 120, as shown in broken lines. Such dielectric encapsulation material 150 may be provided by transfer molding, injection molding, pot molding or any other suitable technique for encapsulating components of the semiconductor assembly 100. It will, therefore, be well appreciated by one of ordinary skill in the art that the dielectric encapsulation material 150 may be formed, for example, using transfer molding over the wire bonds 128 without a wave front of molten dielectric encapsulation material 150 causing wire sweep or wire contact between adjacent wire bonds 128 due to the prior stabilization of such wire bonds 128 in the coating and/or encapsulating of at least a portion thereof by dielectric filler material 140.

As shown in FIG. 3, semiconductor assembly 100 may be completed in a flip-chip configuration with solder balls, conductive or conductor-filled epoxy bumps, pillars or columns or other discrete conductive elements 160 formed on the second surface 114 of carrier substrate 110 and electrically connected to conductive pads or terminals 118 by conductive traces (not shown), as well known in the art.

FIGS. 4–7 illustrate the carrier substrate 110 with various exemplary, suitable adhesive element arrangements, among a wide variety of adhesive element arrangements, that may be utilized for attaching the semiconductor die 120 thereto. The adhesive element thickness and its arrangement may be selected to provide an adequate gap or standoff 132 to receive dielectric filler material between semiconductor die 120 and carrier substrate 110 and provide an initial, temporary but adequately secure bond between the semiconductor die 120 and carrier substrate 110, after which dielectric filler material 140 may be introduced into the gap or standoff 132 to provide the permanent bond between the semiconductor die 120 and carrier substrate 110.

Figure 4:
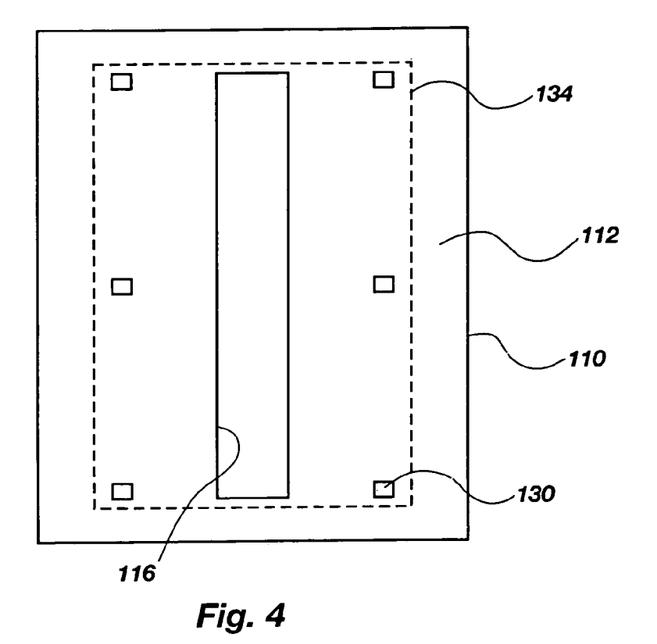
FIG. 4 is a top view of a substrate with an adhesive element arrangement, according to the first embodiment of the present invention.

FIG. 4 depicts a die attach location 134 (shown in broken lines) surrounding an opening 116 on the first surface 112 of the carrier substrate 110. The adhesive elements 130 of the first embodiment may be arranged to provide a plurality of discrete point pads, wherein the point pads may be arranged proximate each inside corner of the die attach location 134. As depicted, additional point pads may be selectively placed, such as being positioned proximately inside the die attach location 134 periphery and midway between the point pads proximate the inside corners, or any other suitable placement that may be desired or required. The discrete point pads may be selectively positioned in a symmetrical or asymmetrical arrangement. At least three, and preferably four, discrete point pads should be used for stability.

Figure 5:
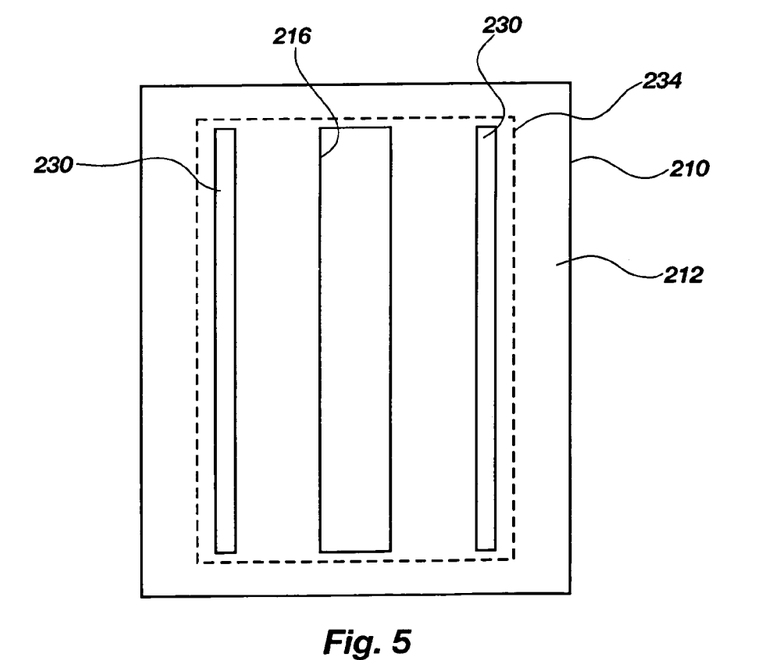
FIG. 5 is a top view of a substrate with an adhesive element arrangement, according to a first variant of the first embodiment of the present invention.

FIG. 5 illustrates a die attach site 234 (shown in broken lines) surrounding an opening 216 on the first surface 212 of a carrier substrate 210 with an arrangement of adhesive elements 230, according to a first variant of the first embodiment. The adhesive elements 230 of the first variant may be arranged to provide a plurality of discrete elongated pads laterally adjacent to the opening 216 and arranged to run longitudinally parallel with the opening 216. As depicted, each elongated pad may extend substantially the length of the die attach site 234. In the alternative, the elongated pads may be broken into multiple pads extending along the length of the die attach site periphery, or any other suitable placement that may be required.

Figure 6:
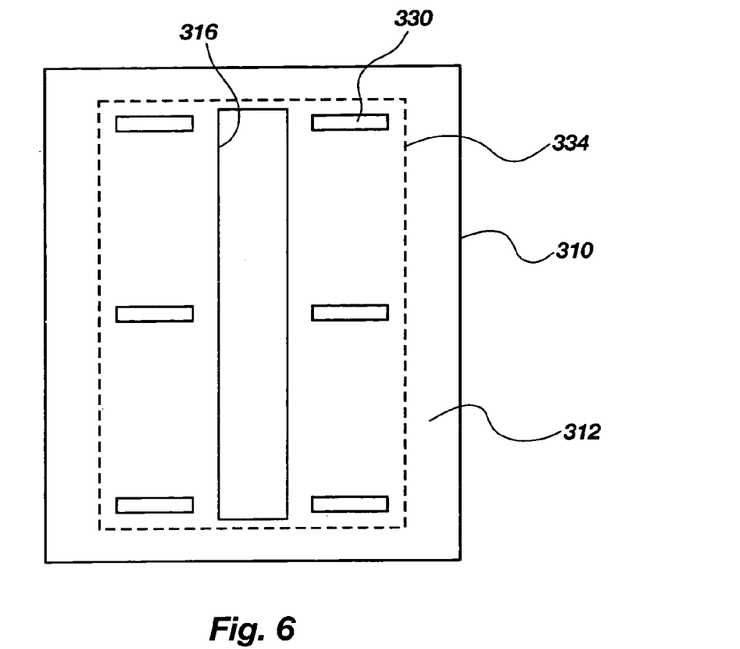
FIG. 6 is a top view of a substrate with an adhesive element arrangement, according to a second variant of the first embodiment of the present invention.

FIG. 6 illustrates a die attach site 334 (shown in broken lines) surrounding an opening 316 on the first surface 312 of a carrier substrate 310 with adhesive elements 330 thereon, according to a second variant of the first embodiment. The adhesive elements 330 of the second variant may be arranged to provide a plurality of discrete elongated pads laterally adjacent to the opening 316 and arranged to extend transverse thereto. As illustrated, the second variant may include three pads on each side of the opening 316. Alternatively, more or fewer pads may be utilized on each side of the opening 316.

Figure 7:
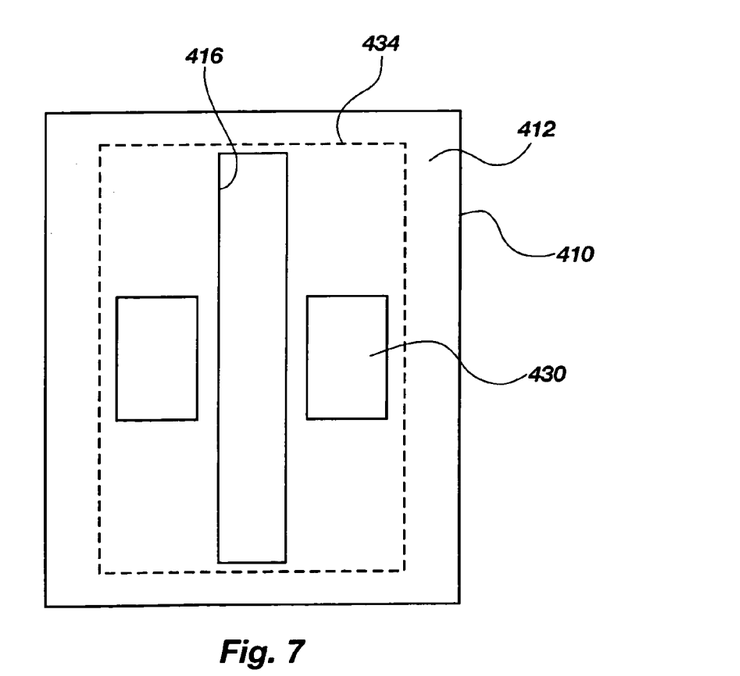
FIG. 7 is a top view of a substrate with an adhesive element arrangement, according to a third variant of the first embodiment of the present invention.

FIG. 7 illustrates a die attach site 434 (shown in broken lines) surrounding an opening 416 on the first surface 412 of the carrier substrate 410 with adhesive elements 430 thereon, according to a third variant of the first embodiment. The adhesive elements 430 of the third variant may be arranged to provide one or more discrete pads positioned centrally on each longitudinal side of the opening 416. As depicted, the third variant may include a single pad positioned on each longitudinal side of the opening 416.

Figure 8:
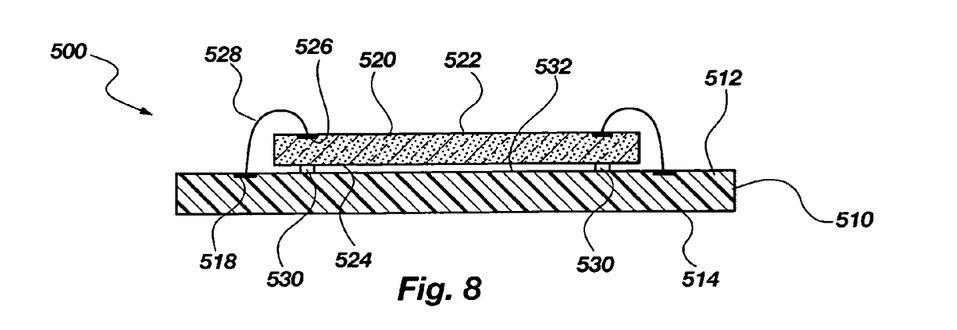
FIG. 8 illustrates a simplified cross-sectional view of a semiconductor assembly, depicting a semiconductor die attached face up to a semiconductor substrate with an adhesive element providing a gap therebetween, according to a second embodiment of the present invention.
Figure 9:
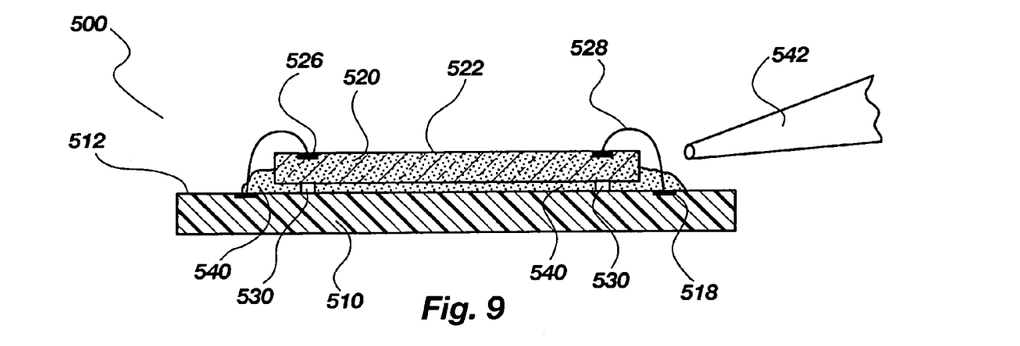
FIG. 9 illustrates a simplified cross-sectional view of a semiconductor assembly, depicting filler material provided in the gap between the semiconductor die and substrate, according to the second embodiment of the present invention.
Figure 10:
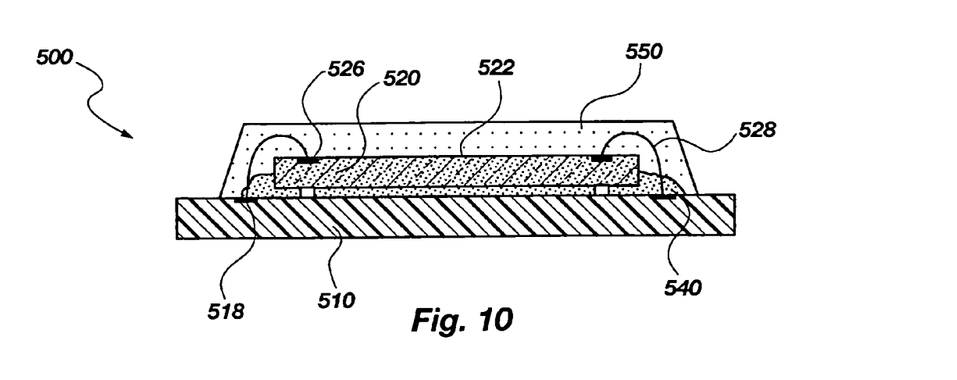
FIG. 10 illustrates a simplified cross-sectional view of a semiconductor assembly, depicting an active surface of the semiconductor die encapsulated by an encapsulation material, according to the second embodiment of the present invention.

FIGS. 8–10 illustrate a method of packaging a semiconductor assembly 500 according to a second embodiment of the present invention. Turning first to FIG. 8, there is depicted a semiconductor die 520 attached to a carrier substrate 510. Semiconductor die 520 includes an active surface 522 and a back surface 524, of which the back surface 524 is attached to carrier substrate 510 with a plurality of adhesive elements 530 providing a gap or standoff 532 between the semiconductor die 520 and the carrier substrate 510. The carrier substrate 510 includes a first surface 512 with conductive pads or terminals 518 thereon and a second surface 514. With the active surface 522 of the semiconductor die 520 exposed upward, wire bonds 528 may be formed to extend from bond pads 526 thereon to the conductive pads or terminals 518 on the substrate 510.

The adhesive elements 530 utilized in the second embodiment may be arranged in any manner so that the arrangement of adhesive elements 530 provides a gap or standoff 532 between the semiconductor die 520 and the carrier substrate 510. Similar to the adhesive element arrangements depicted in FIGS. 4–7, such adhesive element arrangements may also be utilized for the second embodiment as long as the arrangement provides a gap or standoff 532 sufficient to facilitate introduction of a dielectric filler material 540. As before, the adhesive elements 530 may be any known adhesive material, such as a decal or adhesive-coated tape, epoxy drops or segments or preformed adhesive segments, that provides a sufficient initial attachment between semiconductor die 520 and carrier substrate 510. The adhesive element 530 may also comprise metallic elements, such as solder bumps or the like.

FIG. 9 illustrates filling the gap or standoff 532 with dielectric filler material 540 from dispenser head 542 to provide a secure, permanent, substantially inflexible bond between the semiconductor die 520 and the carrier substrate 510. The dielectric filler material 540 also facilitates stabilization of at least a portion of the wire bonds 528 proximate the conductive pads 518 on the first surface 512 of the carrier substrate 510. Such stiffening may prevent wire sweep between adjacent wire bonds 528 during encapsulation of the semiconductor die 520. Dielectric filler material may be alternatively, or additionally, applied over bond pads 526 on active surface 522. FIG. 10 illustrates the semiconductor assembly 500 with an encapsulation material 550 molded over at least the active surface 522 of the semiconductor die 520 or, as shown, over the entire semiconductor die 520 and surrounding area of carrier substrate 510.

As with the embodiment of FIGS. 1–3, semiconductor assembly 500 may be configured for flip-chip attachment to higher level packaging, configured as a vertical surface mount package (VSMP) using one or more rows of contacts along an edge of carrier substrate 510, or otherwise as well known in the art.

Figure 11:
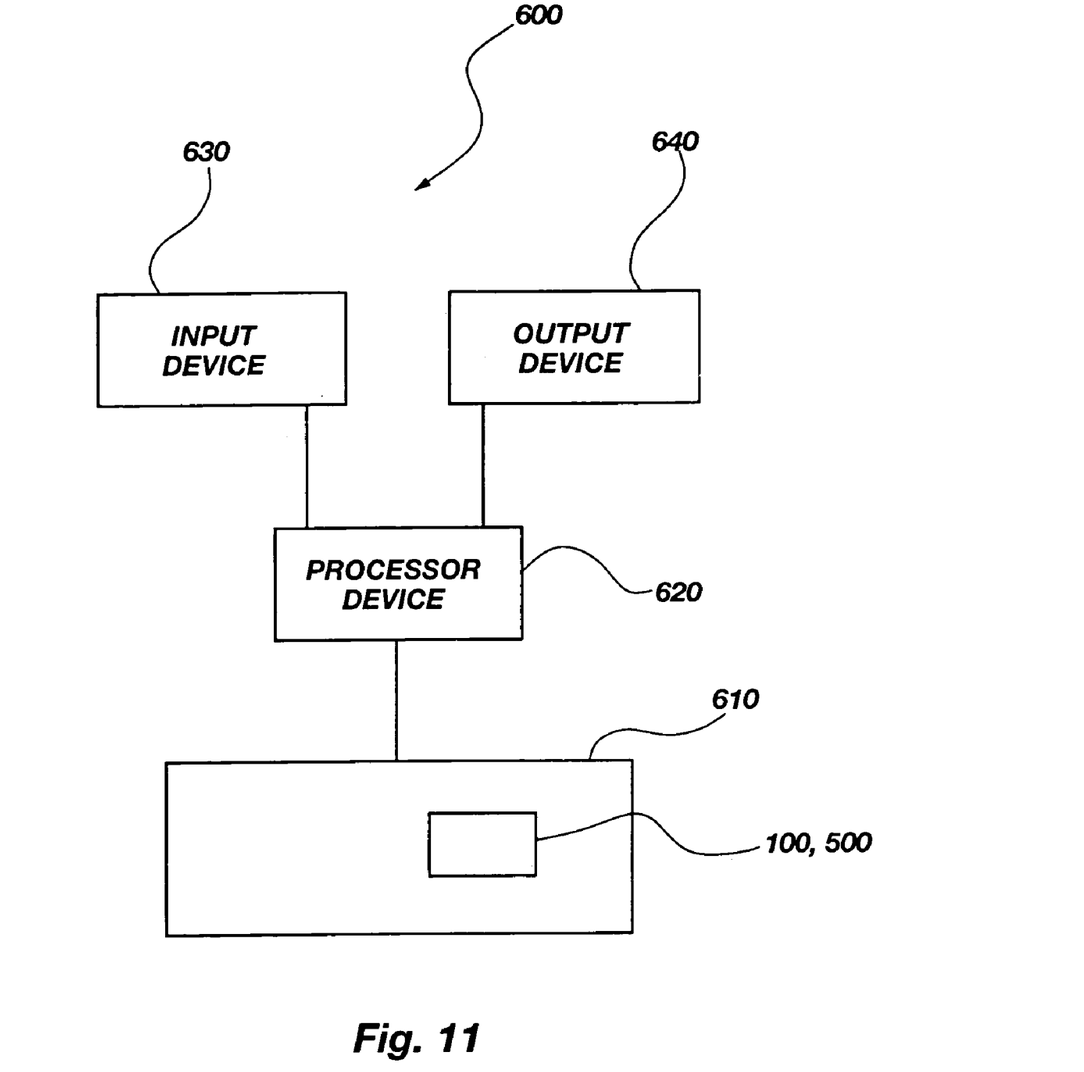
FIG. 11 illustrates a block diagram of the semiconductor assembly of the present invention interconnected to an electronic system, according to the present invention.

As illustrated in block diagram form in FIG. 11, a semiconductor assembly 100, 500 of the present invention may be mounted to a circuit board 610 in an electronic system 600, such as a computer system. In the electronic system 600, the circuit board 610 may be connected to a processor device 620 which communicates with an input device 630 and an output device 640. The input device 630 may comprise a keyboard, mouse, joystick or any other type of electronic input device. The output device 640 may comprise a monitor, printer or storage device, such as a disk drive, or any other type of output device. The processor device 620 may be, but is not limited to, a microprocessor or a circuit card including hardware for processing instructions for the electronic system 600. Additional structure for the electronic system 600 is readily apparent to those of ordinary skill in the art.

Thus, it will be appreciated that the present invention provides a less costly, but structurally superior semiconductor assembly and package through reduction or elimination of the use of adhesive-coated tape. Moisture problems are substantially eliminated and a robust, substantially rigid package is formed, reducing or eliminating stress defects. Further, wire sweep problems are also substantially eliminated, increasing yield.

In addition, when molding a dielectric encapsulant material by transfer molding onto a board on chip assembly (such as that of FIG. 1), it is highly desirable to introduce the molding compound forming the dielectric encapsulant material into the mold cavity containing the semiconductor die attached to the carrier substrate to flow around the bottom (backside) of the semiconductor die first and then to finish at the top (wire bond side). If the molding compound enters the opening or slot first, the pressure created in the mold cavity will cause the molding compound to bleed out of the mold cavity. By use of the present invention and introducing a dielectric filler material between the semiconductor die and carrier substrate and into the slot prior to transfer molding, the front of the slot is effectively sealed and bleed during the molding process is prevented.

Further, the present invention affords enhanced flexibility in assembling the semiconductor die to a carrier substrate. Without the present invention, there must be a certain amount or degree of overlap of the periphery of the semiconductor die over the carrier substrate beyond the opening or slot to prevent bleed. Unfortunately, and contrary to the overlap requirement, there also must be a certain amount of clearance between an end of the slot and the first active bond pad of the semiconductor die at the end of a row of bond pads or the semiconductor die cannot be wire bonded. The present invention, by enabling the filling of the slot with a dielectric filler material prior to transfer molding, enables one to center the semiconductor die with respect to the slot, which effectively makes more die area available to populate with active bond pads, enabling higher I/O counts and enhancing design flexibility.

While the present invention has been disclosed in terms of a certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A semiconductor assembly comprising:
    a carrier substrate having conductive pads exposed on a surface thereof;
    a semiconductor substrate adjacent the carrier substrate and having an active surface and a back surface, the active surface having bond pads exposed thereon;
    a plurality of wire bonds extending between the bond pads of the semiconductor substrate and the conductive pads of the carrier substrate;
    a plurality of spaced adhesive elements disposed in a standoff volume between a face of the carrier substrate and an opposing surface of the semiconductor substrate; and
    a volume of dielectric filler material disposed between adjacent spaced adhesive elements in the standoff volume and bonding the semiconductor substrate to the carrier substrate, wherein the dielectric filler material fills a majority of the standoff volume.

2. The semiconductor assembly of claim 1, wherein the carrier substrate comprises a first surface, a second surface and an opening extending through the carrier substrate therebetween, the second surface having the conductive pads exposed thereon, the semiconductor substrate located over the first surface of the carrier substrate so that the bond pads are exposed through the opening and the plurality of wire bonds extends through the opening between the bond pads and the conductive pads.

3. The semiconductor assembly of claim 1, wherein the plurality of spaced adhesive elements comprises a substantially symmetrical adhesive element arrangement.

4. The semiconductor assembly of claim 1, wherein the plurality of spaced adhesive elements comprises adhesive point pads mutually separate and discrete from each other.

5. The semiconductor assembly of claim 4, wherein at least some of the spaced adhesive point pads are positioned proximate at least corner portions of the semiconductor substrate.

6. The semiconductor assembly of claim 5, wherein at least some of the spaced adhesive point pads are positioned proximate at least one peripheral edge of the semiconductor substrate.

7. The semiconductor assembly of claim 1, wherein the plurality of spaced adhesive elements comprises elongated pads mutually separate and discrete from each other.

8. The semiconductor assembly of claim 2, wherein the plurality of spaced adhesive elements comprises elongated pads mutually separate and discrete from each other.

9. The semiconductor assembly of claim 8, wherein the elongated pads are positioned laterally adjacent the opening and extend substantially parallel to the opening.

10. The semiconductor assembly of claim 8, wherein the elongated pads are positioned laterally adjacent the opening and extend substantially transverse to the opening.

11. The semiconductor assembly of claim 1, wherein the dielectric filler material coats or encapsulates at least portions of at least some of the plurality of wire bonds.

12. The semiconductor assembly of claim 11, further comprising a volume of dielectric encapsulation material extending over at least exposed portions of wire bonds having portions coated or encapsulated by the dielectric filler material.

13. The semiconductor assembly of claim 12, further comprising a volume of dielectric encapsulation material extending over at least a majority of the semiconductor substrate.

14. The semiconductor assembly of claim 1, wherein the dielectric filler material substantially fills the standoff volume.

15. The semiconductor assembly of claim 1, wherein the plurality of spaced adhesive elements comprises at least one of a decal, a tape segment and a volume of adhesive.

16. The semiconductor assembly of claim 1, wherein the semiconductor substrate comprises one or more semiconductor dice.

17. The semiconductor assembly of claim 1, wherein the carrier substrate comprises at least one of a BT resin, a ceramic material, a polymeric material, FR-4 material and FR-5 material.

18. The semiconductor assembly of claim 1, wherein the carrier substrate comprises a first surface and a second surface, the first surface having the conductive pads exposed thereon, the back surface of the semiconductor substrate located over the first surface of the carrier substrate.

19. An electronic system comprising:
a processor device coupled to an input device and an output device; and
a semiconductor assembly coupled to at least one of the processor device, the input device and the output device, the semiconductor assembly comprising:
a carrier substrate having conductive pads exposed on a surface thereof;
a semiconductor substrate adjacent the carrier substrate and having an active surface and a back surface, the active surface having bond pads exposed thereon;
a plurality of wire bonds extending between the bond pads of the semiconductor substrate and the conductive pads of the carrier substrate;
a plurality of spaced adhesive elements disposed in standoff volume between a face of the carrier substrate and an opposing surface of the semiconductor substrate; and
a volume of dielectric filler material disposed between adjacent spaced adhesive elements in the standoff volume and bonding the semiconductor substrate to the carrier substrate, wherein the dielectric filler material fills a majority of the standoff volume.

20. The electronic system of claim 19, wherein the carrier substrate comprises a first surface, a second surface and an opening extending through the carrier substrate therebetween, the second surface having the conductive pads exposed thereon, the semiconductor substrate located over the first surface of the carrier substrate so that the bond pads are exposed through the opening and the plurality of wire bonds extends through the opening between the bond pads and the conductive pads.

21. The electronic system of claim 19, wherein the plurality of spaced adhesive elements comprises a substantially symmetrical adhesive element arrangement.

22. The electronic system of claim 19, wherein the plurality of spaced adhesive elements comprises adhesive point pads mutually separate and discrete from each other.

23. The electronic system of claim 22, wherein at least some of the adhesive point pads are positioned proximate at least corner portions of the semiconductor substrate.

24. The electronic system of claim 22, wherein at least some of the adhesive point pads are positioned proximate at least one peripheral edge of the semiconductor substrate.

25. The electronic system of claim 19, wherein the plurality of spaced adhesive elements comprises elongated pads mutually separate and discrete from each other.

26. The electronic system of claim 20, wherein the plurality of spaced adhesive elements comprises elongated pads mutually separate and discrete from each other.

27. The electronic system of claim 26, wherein the elongated pads are positioned laterally adjacent the opening and extend substantially parallel to the opening.

28. The electronic system of claim 26, wherein the elongated pads are positioned laterally adjacent the opening and extend substantially transverse to the opening.

29. The electronic system of claim 19, wherein the dielectric filler material coats or encapsulates at least portions of at least some of the plurality of wire bonds.

30. The electronic system of claim 29, further comprising a volume of dielectric encapsulation material extending over at least exposed portions of wire bonds having portions coated or encapsulated by the dielectric filler material.

31. The electronic system of claim 30, further comprising a volume of dielectric encapsulation material extending over at least a majority of the semiconductor substrate.

32. The electronic system of claim 19, wherein the dielectric filler material substantially fills the standoff volume.

33. The electronic system of claim 19, wherein the plurality of spaced adhesive elements comprises at least one of a decal, a tape segment and a volume of adhesive.

34. The electronic system of claim 19, wherein the semiconductor substrate comprises one or more semiconductor dice.

35. The electronic system of claim 19, wherein the carrier substrate comprises at least one of a BT resin, a ceramic material, a polymeric material, FR-4 material and FR-5 material.

36. The electronic system of claim 19, wherein the carrier substrate comprises a first surface and a second surface, the first surface having the conductive pads exposed thereon, the back surface of the semiconductor substrate located over the first surface of the carrier substrate.

37. A semiconductor assembly comprising:
a semiconductor substrate attached to a carrier substrate with a plurality of mutually spaced elements disposed in an area of overlap between a surface of the semiconductor substrate and an opposing surface of the carrier substrate and a plurality of wire bonds extending between the semiconductor substrate and the carrier substrate; and
a volume of dielectric filler material disposed between adjacent mutually spaced elements in the area of overlap, wherein the semiconductor substrate is attached to the carrier substrate primarily by the volume of dielectric filler material.

38. The semiconductor assembly of claim 37, wherein the dielectric filler material surrounds at least portions of at least some of the plurality of wire bonds.

39. The semiconductor assembly of claim 38, further including a dielectric encapsulation material at least encapsulating exposed portions of the at least some of the plurality of wire bonds.

40. The semiconductor assembly of claim 37, wherein the plurality of wire bonds extends through an opening in the carrier substrate.

41. The semiconductor assembly of claim 40, wherein the dielectric filler material surrounds at least portions of at least some of the plurality of wire bonds.

42. The semiconductor assembly of claim 41, further including a dielectric encapsulation material at least encapsulating exposed portions of the at least some of the plurality of wire bonds.

* * * * *

UNITED STATES PATENT AND TRADEMARK OFFICE
CERTIFICATE OF CORRECTION

| | | |
|---|---|---|
| PATENT NO. | : 7,116,000 B2 | Page 1 of 1 |
| APPLICATION NO. | : 10/785122 | |
| DATED | : October 3, 2006 | |
| INVENTOR(S) | : Frank L. Hall and Cary J. Baerlocher | |

It is certified that error appears in the above-identified patent and that said Letters Patent is hereby corrected as shown below:

In the claims:
CLAIM 19, COLUMN 11, LINES 29-30, after "in" and before "standoff" insert --a--

Signed and Sealed this

Twentieth Day of November, 2007

JON W. DUDAS
*Director of the United States Patent and Trademark Office*